United States Patent
Uno

(10) Patent No.: US 6,350,981 B1
(45) Date of Patent: Feb. 26, 2002

(54) PHOTO-SENSOR

(75) Inventor: Masayuki Uno, Ina (JP)

(73) Assignee: Olympus Optical Co., LTD (JP)

( * ) Notice: Subject to any disclaimer, the term of this patent is extended or adjusted under 35 U.S.C. 154(b) by 0 days.

(21) Appl. No.: 09/448,230

(22) Filed: Nov. 24, 1999

(30) Foreign Application Priority Data

Nov. 27, 1998 (JP) .......................................... 10-336921

(51) Int. Cl.[7] .............................................. H01J 40/14
(52) U.S. Cl. .............................. 250/214 R; 250/208.1
(58) Field of Search ........................ 250/208.1, 214 R, 250/214.1; 348/308–314, 297; 257/290, 291

(56) References Cited

U.S. PATENT DOCUMENTS 6,147,338 A * 11/2000 Takahashi ................. 250/208.1

FOREIGN PATENT DOCUMENTS

| JP | 64-18255 | 1/1989 |
| JP | 7-203319 | 8/1995 |

OTHER PUBLICATIONS

"Infrared Readout Electronics: A Historical Perspective," Hewitt et al., Hughes Aircraft Company, Santa Barbara Research Center, Goleta, California, SPIE vol. 2226 Infrared Readout Electronics II, (1994), pp. 108–119. (Month Unknown).

* cited by examiner

Primary Examiner—Que T. Le
(74) Attorney, Agent, or Firm—Ostrolenk, Faber, Gerb & Soffen, LLP

(57) ABSTRACT

A photo-sensor capable of accurate removal of photo-current due to background light when sensing the photo-current due to light projection and having frequency band of photo-current sensing system independent of photo-diode current is disclosed. A transistor having the source connected to the photo-electric converting element for passing photo-current generated in the photo-electric converter. An inverting amplifier includes the input side connected to the juncture between the photo-electric converting element and the transistor for amplifying the output signal from the photo-electric converting element. A signal storing circuit is provided between the source and the gate of the transistor for storing a signal corresponding to the photo-current. A switching element is provided between the output side of the inverting amplifier and the gate of the transistor.

7 Claims, 8 Drawing Sheets

PHOTO-SENSOR

BAKCROUND OF THE INVENTION

The present invention relates to photo-sensors and more particularly, to photo-sensors effectively applied to cameras and the like.

The auto-focusing (AF) systems of cameras are roughly classified into two types, i.e., passive and active types. In the former type, the scene to be picked up is passed through two lenses (or separator lenses) to obtain two images for sensing with respective sensors, and distance measurement is performed from the distance between the two sensed images. In the latter type, a light beam is projected from an LED in a camera body or the like onto the scene, and distance measurement is performed by detecting the position of the reflected light beam. The former type systems have a problem that the accuracy of the distance measurement is reduced when the contrast of the scene is low. The latter type systems have a problem that it is impossible to detect the light projected form the LED when the background of the scene is bright. Both type systems thus have their own merits and demerits.

In the presence of these problems, Japanese Patent Laid-Open No. 64-18255 discloses a line sensor for the active AF system which permits expanding the imaging scene capable of AF by removing background light. FIG. 9 shows the construction of one pixel of the disclosed line sensor, and FIG. 10 outlines an active AF module.

Referring to FIG. 9, a photo-sensor cell 101 is shown, which includes a MOS transistor FT6 and a p-channel and an n-channel MOS transistor FT10 and FT11. The MOS transistor FT6 has its drain D6 connected to the drain D10 of the MOS transistor FT10. The MOS transistor FT10 has its source S10 held at a reference potential $V_{ref}$ and its gate G10 connected to one terminal of a capacitor 107 as shown. The MOS transistor FT11 is connected to the drain D6 of the MOS transistor FT6 as shown. The MOS transistor FT11 serves to turn on and off the gate G10 and the drain D10 of the MOS transistor FT10 according to a switching signal SW applied to its gate G11. In the application of a solid-state imager having the photo-sensor cell 101 to a light-receiving element 124 as shown in FIG. 10, before the measurement of the distance of a scene 122 the charge corresponding to photo-current $I_{SHO}$, which is generated in a photo-diode 102 by the light other than the signal light, i.e., background light, is stored in the capacitor 107.

As shown in FIG. 9, the photo-diode 102 is connected to one terminal of a MOS transistor FT0 having the other terminal connected to one terminal of a switching transistor T1. The switching transistor FT1 is connected to one terminal of a capacitor 105, and its switching operation is brought about with a data accumulation signal DT applied to its gate G1. The capacitor 105 is connected to a switching element FT3, and its terminal voltage $V_0$ is initialized to the reference potential $V_{ref}$ by turning on the switching element FT3 with a reset signal RST applied to the gate G3 of the element FT3. In the circuit construction shown in FIG. 9, transistors FT4 and FT5, a constant current source 103 including transistors FT7 and FT8 and the capacitor 105 constitutes a circuit for outputting the signal detected by the above circuit construction. That is, an output corresponding to the terminal voltage $V_0$ across the capacitor 105 is outputted to a video line 104 in a manner as will be described hereinunder.

For storing background light in the above circuit, prior to the distance measurement the photo-diode 102 and the capacitor 105 are held disconnected from each other without supplying the data accumulation signal DT to the gate G1 of the switching transistor FT1. Also, the terminal voltage $V_0$ across the capacitor 105 is initialized to the reference potential $V_{ref}$ by applying the reset signal RST to the gate G3 of the switching transistor FT3 as noted above. Furthermore, the light source 120, i.e., the LED, is not driven, so that no signal light is incident on the photo-diode 102 but the sole background light is incident on the light-receiving element 124. Still further, the switching signal SW is held to be at a high level to hold the MOS transistor FT11 "ON". In this state, the MOS transistor FT10 functions as a load having a predetermined resistance, and the photo-current $I_{SHO}$ generated in the photo-diode 102 by the background light, is supplied from the reference potential $V_{ref}$ to flow through the MOS transistor FT10 and the transistor FT6 into the photo-diode 102.

As stated before, the photo-diode 102 and the capacitor 105 are held disconnected at this time. Thus, the flow of the photo-current $I_{SHO}$ due to the background light causes the terminal voltage across the capacitor 107 to become lower than the reference potential $V_{ref}$ in correspondence to the resistance of the MOS transistor FT10 functioning as the load. In other words, the charge corresponding to the photo-current $I_{SHO}$ due to the background light is accumulated in the capacitor 107.

As the charge is accumulated in the capacitor 107, it is eventually saturated. Thus, the saturated accumulation charge caused by the photo-current $I_{SHO}$ due to the background light can be stored in the capacitor 107. That is, the photo-current $I_{SHO}$ can be stored as the voltage at the gate G10 of the MOS transistor FT10.

In this state, signal accumulation of pixel data as signal light in the capacitor 105 can be started. Specifically, at this time the light source 120 is driven to let signal light be incident on the light-receiving element 124, i.e., the photo-diode 102, while at the same time the data accumulation signal DT is applied to the gate G1 of the switching transistor FT1 to turn on this transistor and connect the capacitor 105 and the photo-diode 102 to each other.

Although background light is incident on the photo-diode 102 at this time in superimposition on the signal light, since the photo-current $I_{SHO}$ due to the background light flows on the basis of the voltage stored at the gate G10 of the MOS transistor FT10, only photo-current $I_{SH}'$ due to the signal light flows from the capacitor 105 to the photo-diode 102.

Thus, the terminal voltage $V_0$ across the capacitor 105 is reduced from the initial level $V_{ref}$ according to the sole photo-current $I_{SH}'$ due to the signal light. It is thus possible to obtain a voltage change corresponding to the sole signal light intensity, that is, detect a signal free from the influence of the background light.

By turning on the switching element FT5, which is connected to the transistor FT4 and the current amplifier constituted by the constant current source 103 including the transistors FT7 and FT8, i.e., a source follower, the accumulated terminal voltage V0 across the capacitor 105 is read out through the switching element FT5 to a video line 104.

Photo-sensor cells as described above are arranged one- or two-dimensionally to form a line or an area sensor. The line sensor described in the disclosure noted above is summarized as follows. The MOS transistors FT10 and FT11 and the capacitor 107 constitute a current memory to store photo-current ISHO due to background light. In addition, the switching transistor FT1, the transistor FT3 and the capacitor 105 constitute a photo-current sensor for sensing signal light. Thus, the sole photo-charge corresponding to the light projected from the light source is accumulated and read out to reduce the adverse effects of the background light.

The line sensor shown in FIG. 9, however, has the following drawback. Denoting the voltage applied to the gate of the MOS transistor FT6 by $V_G$, the gate-source voltage across this transistor by $V_{GS6}$ and the gate-source voltage across the MOS transistor FT0 by $V_{GS0}$, when the data accumulation signal DT is "OFF", that is, when storing the background light in the capacitor 107, the terminal voltage $V_{PD}$ across the photo-diode 102 is given as:

$$V_{PD}=V_G-V_{GS6}(I_{SHO}) \quad (1)$$

At this time, since the MOS transistor FT0 is "off", $V_{PD}$ corresponds to $I_{SHO}$.

When the data accumulation data DT is turned on denoting the voltage applied to the gate of the MOS transistor FT0 by $V_G$, the terminal voltage $V_{PD}$ across the photo-diode 102 is expressed in the following two ways.

$$V_{PD}=V_G-V_{GS6}(I_{SHO})$$
$$\text{and } V_{PSD}=V_G-V_{GS0}(I_{SHO}') \quad (2)$$

As shown, the terminal voltage $V_{PD}$ across the photo-diode 102 is determined on the basis of the influence of both the gate-grounded MOS transistors FT6 and FT0, and a feed-back is provided such that $V_{GS6}=V_{GS0}$. For example, the feed-back has an effect of increasing the drain voltage at the MOS transistors FT0 and FT6 and reducing the source-drain voltage across the MOS transistor FT10, thus making the current $I_{SH0}$ flowing out from the current memory to be lower than the stored level. In the long run, $I_{SH0}=I_{SH}'$ is provided by the feed-back, so that the charge accumulation in the capacitor 105 will include other influence than that by the background light. In other words, with the line sensor of the structure as shown in FIG. 9 no great improvement with respect to the background light can be expected.

The inventor accordingly has proposed a solid-state imager capable of solving the above problem in Japanese Patent Laid-Open No. 7-203319. FIG. 11 shows an example of the disclosed structure.

Referring to FIG. 11, a transistor 1 has its source connected to a photo-diode 2 and its drain connected to a charge accumulation capacitor 5. An inverter 12 which includes a source-grounded amplifying transistor 10 and a load transistor 11 serving as a load of the transistor 10 and having the gate held at a fixed potential VBIAS1, provides an output fed to the gate of the transistor 1. The input side of the inverter 12, i.e., the gate of the source-grounded p-MOS transistor 10, is connected to the photo-diode 2. The inverter 2 and the transistor 1 form together a feed-back loop, and the photo-diode 2 is substantially held in a low impedance state. Thus, the potential at the photo-diode 2 serves as a constant bias, and photo-charge generated in the photo-diode 2 steadily flows through the transistor 1 to the charge accumulation capacitor 5 irrespective of its magnitude.

A current memory 13 which includes a current memory transistor 6, a current memory capacitor 7 and a switching transistor 8 having the gate to which a control pulse signal $\Phi_{MC}$ for controlling the sampling and holding of the current to be stored, is connected in parallel with the charge accumulation capacitor 5. An amplifier 14 is provided to amplify the voltage across the capacitor 5. Although only a single one is shown, a plurality of selection transistors 9 which each have the gate connected to a shift register 3 for selectively outputting the output of each of the amplifiers 14 which each correspond to each pixel (not shown), are each provided between each amplifier and the video line.

The operation of the solid-state imager having the above construction will now be described. The pixels of the solid-state imager are each operated as follows to read out a signal corresponding to the light projected from the light source while removing the background light.

When the control pulse $\Phi_{MC}$ is turned on in the absence of light projected from the light source, photo-current $I_{PD}$ generated due to the background light in th e photo-diode 2 entirely flows into the current memory transistor 6, and thus we have $I_{PD}=I_M$. At this time, the potential at the node N1, i.e., at the charge accumulation capacitor 5, is constituted by the source-gate voltage $V_{GS}$ of the current memory transistor 6 corresponding to $I_M$.

A state when the switching transistor 8 is subsequently turned off will now be considered. Even in this state, $I_{PD}=I_M$ if feed-through charge of the transistor 8 is ignored. At this time, the node N1 assumes a floating state and held at $V_{GS}$. By causing the light projection from the light source in this state, in each pixel receiving the reflected light photo-current $I_{PD}'$ due to the light projection to $I_{PD}$ to obtain $I_{PD}+I_{PD}'$. Consequently, sole charge corresponding to the photo-current $I_{PD}'$ due to the light projection is accumulated in the charge accumulation capacitor 5.

After the end of the light projection, the charge accumulation signal is read out of each capacitor 5 through each amplifier 14 to the video line 4 by successively turning on the selection transistors 9. By reading out the outputs of all the pixels in this way, it is possible to detect the position of the light-receiving element, at which the reflected light corresponding to the projected light is incident.

With the construction as described, the problem posed in the case of the structure shown in FIG. 9 can be solved to obtain sensing of the projected light while effectively removing the background light. As a result of investigations, however, the following problems were found.

(1) With accumulation of the photo-current $I_{PD}'$ due to the light projection in the charge accumulation capacitor 5, the voltage at the node N1 is changed, causing changes in the source-drain voltage across the transistor 6 generating the memory current $I_M$ and thus deviation of the level of the memory current $I_M$ from the stored level. This means that when the photo-current $I_{PD}$ due to the background light, i.e., the memory current $I_M$, is high compared to the photo-current $I_{PD}'$ doe to the light projection, the deviation of the memory current $I_M$ corresponding to the photo-current $I_{PD}'$ due to the light projection has great effects, making it impossible to obtain accurate measurement of the photo-current $I_{PD}'$ due to the light projection.

(2) The photo-current $I_{PD}$ due to the background light causes changes in the conductance of the transistor 1, and the frequency band of the first stage circuit constituted by the inverter 12 and the transistor 1 is changed in dependence on the photo-current. Particularly, when the photo-current $I_{PD}$ due to the background light is low, the conductance is extremely reduced, making it difficult to increase the frequency band of the circuit again.

SUMMARY OF THE INVENTION

The present invention was proposed in view of the above problems, and it has an object of providing a photo-sensor capable of accurate removal of photo-current due to background light when sensing the photo-current due to light projection, and in which the frequency band of the photo-current sensing system is independent of photo-diode current.

According to a first aspect of the present invention, there is provided a photo-sensor comprising a photo-electric converting element, a transistor having the source connected to the photo-electric converting element for passing photo-current generated in the photo-electric converter, an inverting amplifier having the input side connected to the juncture between the photo-electric converting element and the transistor for amplifying the output signal from the photo-electric converting element, a signal storing circuit provided between the source and the gate of the transistor for storing a signal corresponding to the photo-current, and a switching element provided between the output side of the inverting amplifier and the gate of the transistor.

In the photo-sensor according,
  the switching element executes a switching operation in correspondence to the timing of storing the output signal from the photo-electric converting element in the signal storing circuit;
  the signal storing circuit contains a gate capacitance of the transistor;
  the signal storing circuit contains the gate capacitance of the transistor that is determined by the size of the gate area of the transistor;
  a signal accumulation capacitor and a switching element for resetting the signal accumulation capacitor are provided between the input and output sides of the inverting amplifier;
  a resistor and a switching element in series with the resistor are provided between the input and output sides of the inverting amplifier, and
  the output side of the inverting amplifier is connected to the output side of a second stage inverting amplifier, and a signal accumulation capacitor and a switching element for resetting the signal accumulation capacitor are provided between the input and output sides of the second stage inverting amplifier.

Other objects and features will be clarified from the following description with reference to attached drawings.

PREFERRED EMBODIMENTS OF THE INVENTION

Preferred embodiments of the present invention will now be described with reference to the drawings.

Figure 1:
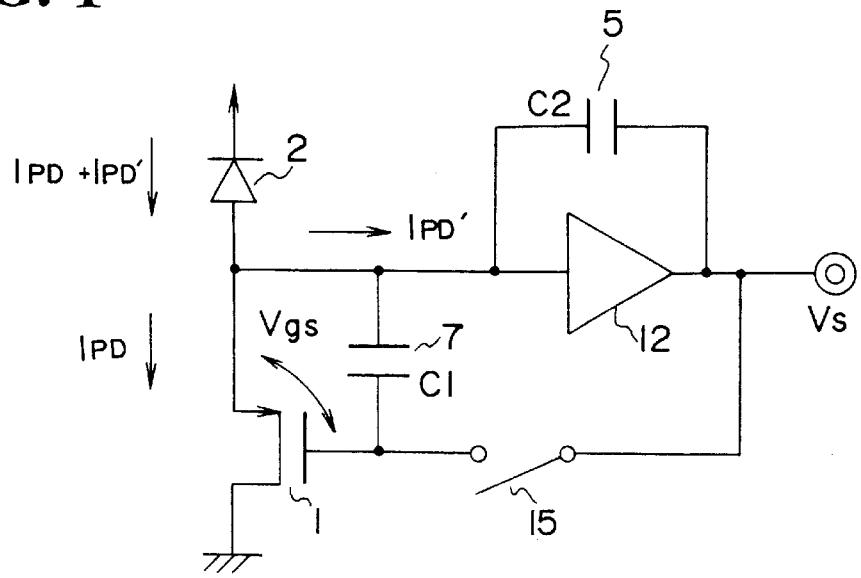
FIG. 1 is a circuit diagram showing the circuit construction of a first embodiment of the photo-sensor according to the present invention.
Figure 10:
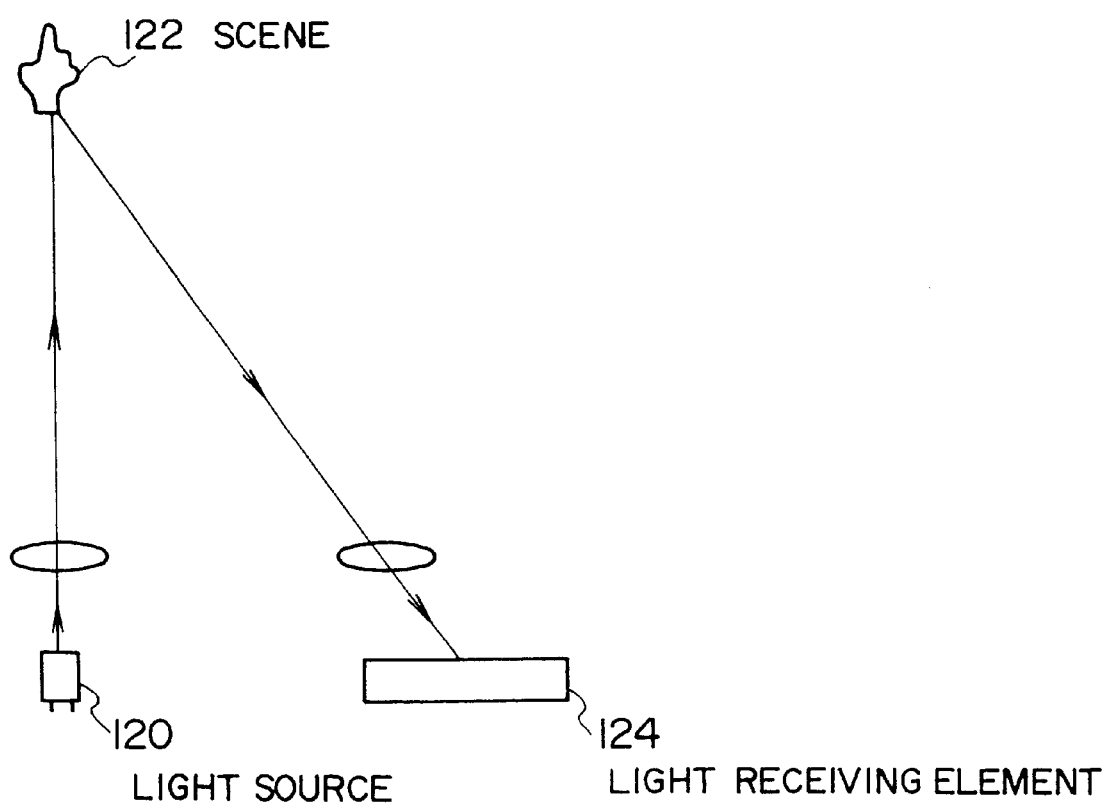
FIG. 10 is a schematic view showing a prior art active type distance measuring system.

FIG. 1 shows a first embodiment of the present invention. This embodiment can be used as, for instance, the light-receiving element 124 of the active AF module as shown in FIG. 10. In the Figure, circuit elements like those in the prior art example described before in connection with FIG. 1 are designated by like reference numerals. As the light source for projecting light on the scene for the distance measurement, an LED or the like is assumed to be used as the light source 120 shown in FIG. 10.

A transistor 1 for detecting signal light has the source connected to one terminal of a photo-diode 2, which has the other terminal connected to a power supply, the drain grounded and the gate connected via a memory switch 15 constituted by a switching transistor or the like to the output of an inverting amplifier 12. A capacitor 7 for storing photo-current is provided between the source and gate of the transistor 1. The connection point between the source of transistor 1 and the photo diode 2 is connected to the input of inverting amplifier 12. The inverting amplifier 12 includes the CMOS inverting amplifier 12 including the p- and n-type MOS transistors 10 and 11 shown in FIG. 11. A capacitor 5 is connected between the input and output sides of the inverting amplifier 12, and serves as an element for providing a feed-back for the photo-current detection.

Figure 2:
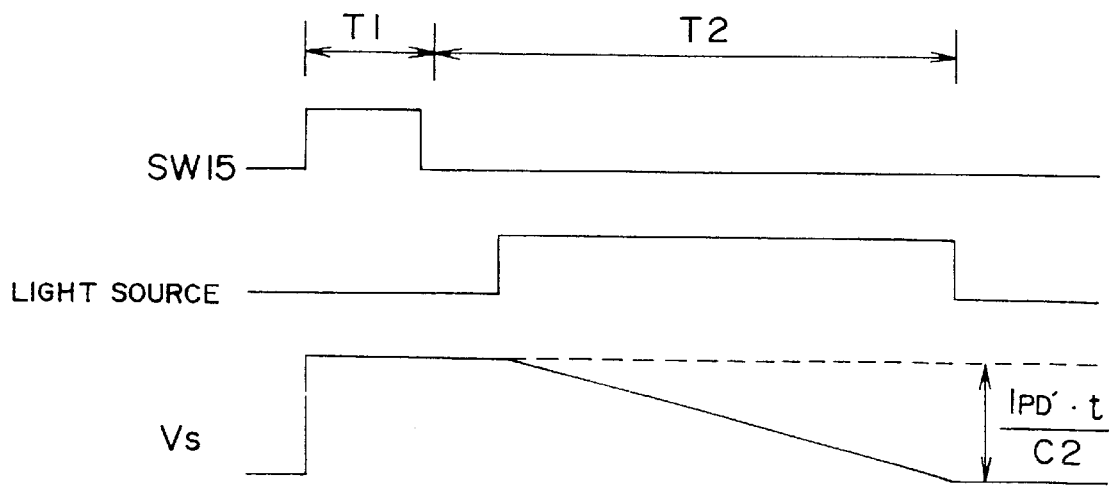
FIG. 2 is a time chart illustrating a background light removal operation and a signal output in the first embodiment of the present invention.

FIG. 2 is a time chart in the case of detecting projected signal light by executing a background light removal operation in the circuit shown in FIG. 1. Labeled SW15 is the operation of the memory switch 15, labeled LIGHT SOURCE is the output of the LED as the light source noted above, and labeled Vs is the output voltage of the inverting amplifier 12 (i.e., the output of the photo-sensor according to the present invention). The operation of the circuit shown in FIG. 1 will now be described with reference to FIG. 2.

During period T1, the sole background light is stored without projection of the LED light onto the scene. By turning on the memory switch 15 in the period T1, the gate voltage on the transistor 1 is fed back via the inverting amplifier 12 such that photo-current $I_{PD}$ generated in the photo-diode 2 by the background light flows through the transistor 1 to the ground. Thus, the source-gate voltage $V_{gs}$ across the transistor 1 corresponds to the photo-current IPD due to the background light. By turning off the memory switch 15 in this state, the source-gate voltage $V_{gs}$ across the transistor 1 is not changed because the capacitor 7 for storing the background light continually holds the stored charge. Thus, the photo-current IPD to the background light continually flows through the transistor 1.

By turning on the LED for light projection onto the scene in next period T2, the photo-current $I_{PD}$ due to the projected light is superimposed on the photo-current $I_{PD}$ due to the background light. The photo-current $I_{PD}$ due to the background light is discharged through the transistor 1, and photo-current $I_{PD}'$ is stored in the capacitor 5 for detecting the projected light. Denoting the LED light projection time by t and the capacitance of the capacitor 5 for the projected light detection by C2, the output voltage $V_s$ is changed by $I_{PD}' \cdot t/C2$.

As shown, with the construction shown in FIG. 1 it is possible to detect the sole photo-current $I_{PD}'$ due to the projected light. That is, with this construction it is possible to accurately detect the photo-current $I_{PD}'$ due to the light projection irrespective of a change in the output of the inverting amplifier 12 due to the projected light. This is so because the source voltage on the transistor 1 is compressed to 1/Av where Av is the open loop gain of the inverting amplifier 12, and thus the source-drain voltage across the transistor 1 is hardly change so that the photo-current $I_{PD}$ due to the background light is held substantially constant. In addition, as is well known in the art, for instance disclosed in SPIB Vol. 2226 (1994), in the "OFF" state of the memory switch 15 the frequency range of the inverting amplifier 12 with the projected light detection capacitor 5 between the input and output sides is independent on photo-current, thus providing great degree of design freedom.

Figure 11:
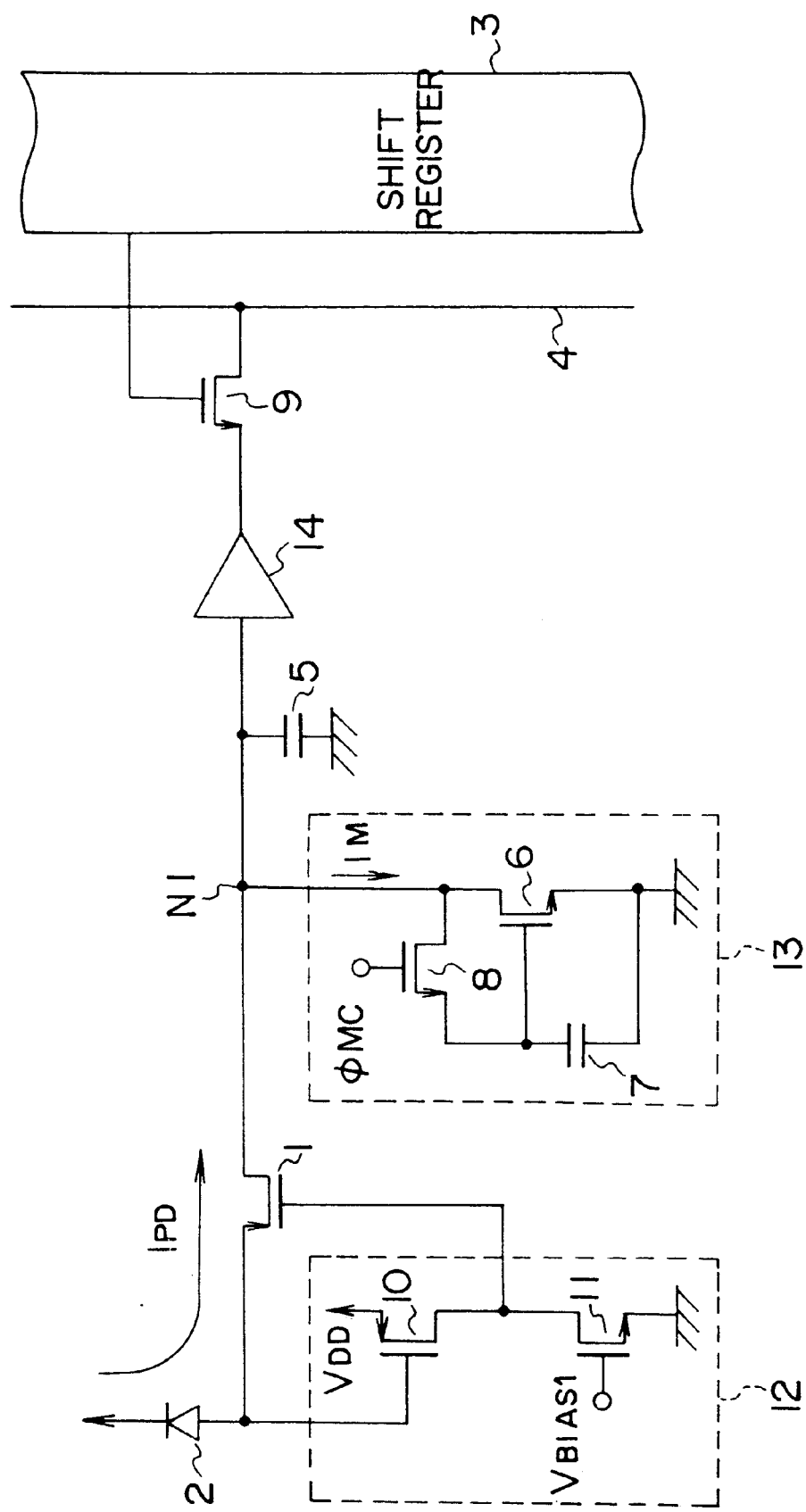
FIG. 11 is a schematic showing a prior art background light removal circuit.

Furthermore, as is seen from the comparison with the structure shown in FIG. 11, with the structure shown in FIG. 1 a function that the inverting amplifier 12 with the projected light detection capacitor 5 connected between the input and output sides provides feed-back to the transistor 1 and a function of amplifying a photo-current integral output are realized. It is thus possible to realize accurate detection of the photo-current due to the projected light with a reduced number of components and thus hold the consumed current within a lower level.

The circuit construction shown in FIG. 1 can be realized with a device of the CMOS structure. For example, an MOS transistor may be used for the memory switch 15, and an MOS gate capacitance may be used for MOS gate capacitor 7. In the MOS gate capacitance, the impurity concentration in the diffusion layer under the gate oxide film is set to be higher than that of the MOS transistor to ensure a linear C-V characteristic.

As a different method of realizing the background light storage capacitor 7, it is possible to utilize the gate capacitance of the transistor 1 itself. In this case, the gate length and the gate width, i.e., the gate area, are set to necessary values for obtaining the desired capacitance. With this arrangement, compared to the connecting a separately formed capacitor to the circuit, no space is necessary for wiring and so forth, and also the 1/f noise of the transistor 1 can be reduced.

Figure 3:
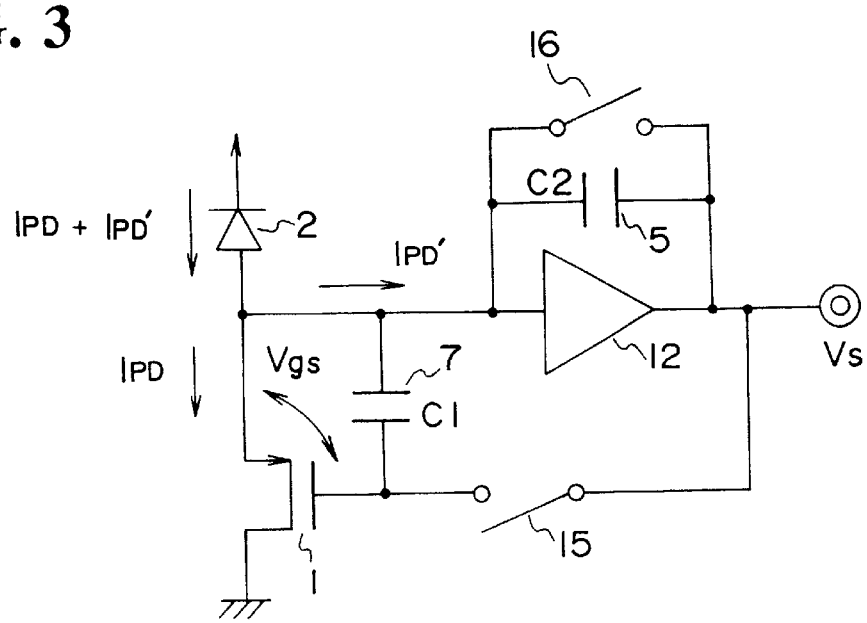
FIG. 3 is a circuit diagram showing the circuit construction of a second embodiment of the imager with an accumulated charge resetting function according to the present invention.

FIG. 3 shows a second embodiment, which is a modification of the structure shown in FIG. 1. In the structure shown in FIG. 1, the output voltage Vs of the inverting amplifier 12 in the period T1 depends on the source-gate voltage $V_{gs}$ across the transistor 1 and also depends on the photo-current $I_{PD}$ due to the background light. Therefore, the output voltage Vs of the inverting amplifier 12 in the period T1 is changed in correspondence to the brightness of the background light. Therefore, the reference voltage when detecting the projected light photo-current in the period T2 succeeding the period Td, is changed with changes in the background light.

Accordingly, in FIG. 3 a reset switch 16 is connected in parallel with the projected light detection capacitor 5 to reset the accumulated charge therein. Before the start of integration of projected light photo-current $I_{PD}'$, in the period T2 the reset switch 16 is turned on to reset the accumulated charge in the capacitor 5. Thus, the integration is always started at a constant potential.

The reset switch 16 can be realized by using an MOS transistor as a switching transistor.

Figure 4:
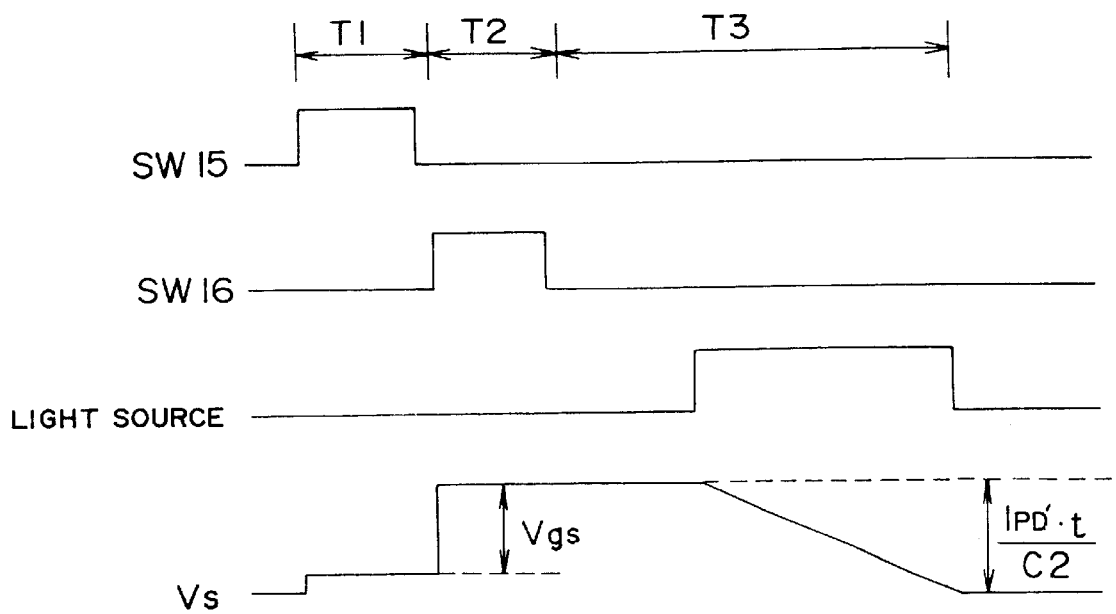
FIG. 4 is a time chart illustrating a background light removal operation and an output signal in the second embodiment of the present invention.

FIG. 4 is a time chart illustrating the operation of the circuit shown in FIG. 3. Referring to the Figure, labeled SW15 is the operation of the memory switch 15, labeled SW16 is the output of the reset switch 16, labeled LIGHT SOURCE is the output of the LED as the light source as described above, and Vs the output voltage of the inverting amplifier (i.e., the output of the photo-sensor shown in FIG. 3). In the Figure, in the period T1 the background light is stored without projection of light from the LED. The source-gate voltage $V_{gs}$ across the transistor 1 is determined such that the photo-current $I_{PD}$ due to the background light is caused to flow by turning on the memory switch 15 and turning off the reset switch 16. By turning on the memory switch 15 in this state, the source-gate voltage $V_{gs}$ of the transistor 1 is held, so that the photo-current $I_{PD}$ due to the background light flows continually.

In the period T2 subsequent to the period T1, the accumulated charge in the projected light detection capacitor 5 is reset by turning on the reset switch 16. With this resetting, the output voltage Vs of the inverting amplifier 12 comes up as a voltage corresponding to the operating point of the circuit of the inverting amplifier at the time of the resetting. At this time, the reset switch 16 is turned off, and subsequently, light is projected from the LED. Like the circuit shown in FIG. 1, the photo-current $I_{PD}$ due to the projected light is accumulated in the projected light detection capacitor 5, thus permitting detection of the corresponding output voltage from the output voltage V of the inverting amplifier 12.

Figure 5:
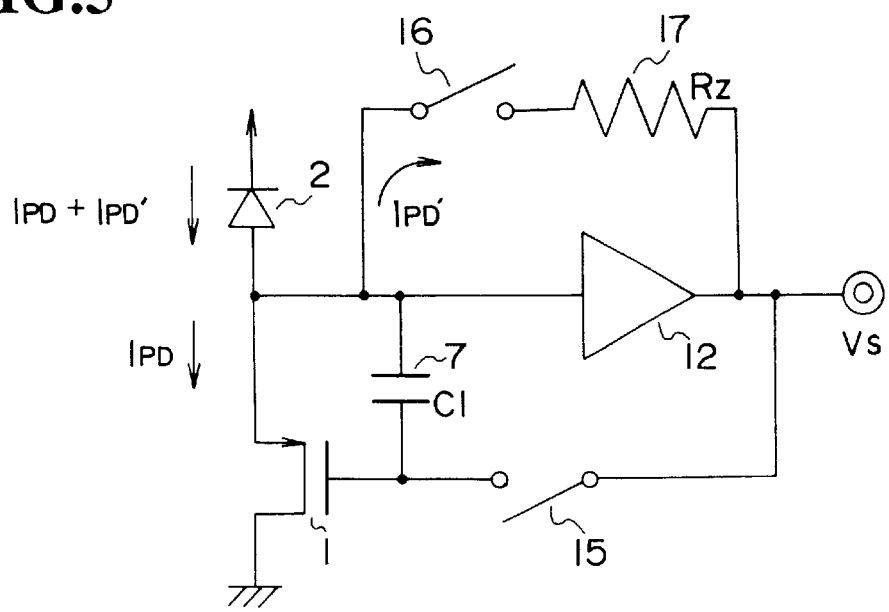
FIG. 5 is a circuit diagram showing the circuit construction of a third embodiment of the imager according to the present invention using a resistor and a switch constituting a feed-back system.

FIG. 5 shows the third embodiment of the present invention. In this embodiment, the feed-back system for the inverting amplifier is realized by using a resistor. Specifically, for detecting the photo-current $I_{PD}'$ due to the projected light, a reset switch 16 constituted by a switching transistor or the like and a transimpedance resistor 17 (for photo-current-to-voltage conversion) are connected in series with each other between the input and output sides of the inverting amplifier 12.

Figure 6:
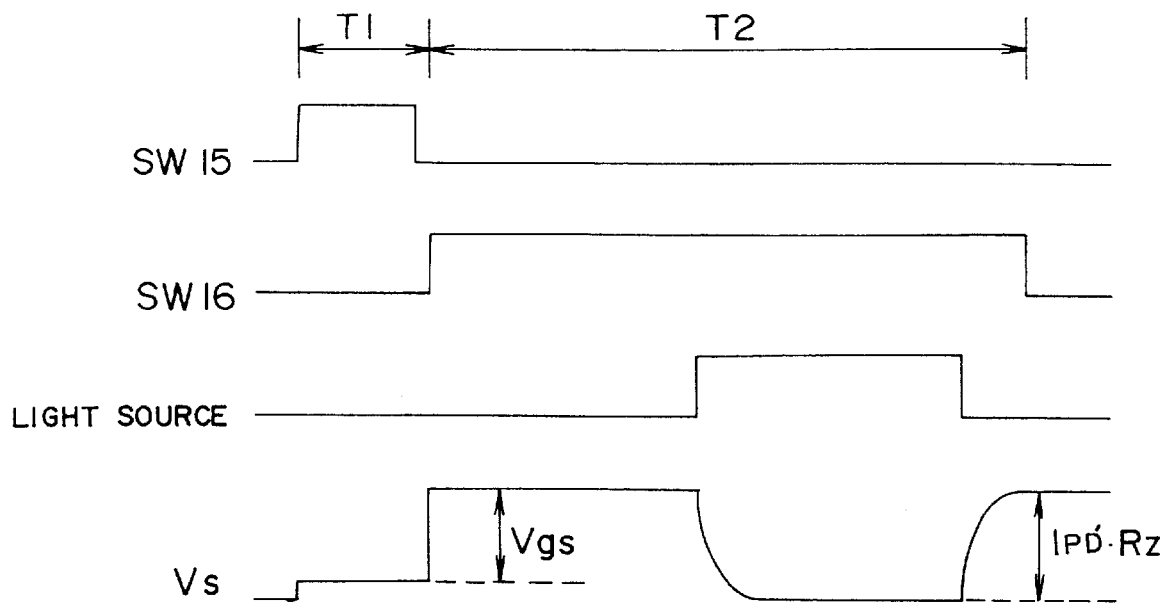
FIG. 6 is a time chart illustrating a background light removal operation and a signal; output in the third embodiment of the present invention.

FIG. 6 is a time chart showing the operation of the circuit shown in FIG. 5. In the Figure SW15 labels the operation of the memory switch 15, SW16 labels the output of the reset switch 16, LIGHT SOURCE labels the output of the LED as the light source noted before, and Vs labels the output voltage of the inverting amplifier 12 (i.e., the output of the photo-sensor shown in FIG. 5). Referring to the Figure, in the period T1 photo-current $I_{PD}$ due to the background light is stored in the capacitor 7 by turning on the memory switch 15 and turning off the reset switch 16 without LED light projection.

In the period T2 subsequent to the period T1, the memory switch 15 is turned off while turning on the reset switch 16 and holding the state of no light projection from the LED. No current thus flows through the transimpedance resistor 17, and like the previous embodiment the output voltage Vs of the inverting amplifier 12 comes up as a voltage corresponding to the operating point of the circuit of the inverting amplifier 12.

By subsequently projecting light from the LED, the output voltage Vs of the inverting amplifier 12 is reduced by $I_{PD}' \cdot Rz$ where Rz is the resistance of the resistor 17 caused by an increase of the photo-current $I_{PD}$ due to the light projection. The photo-current $I_{PD}'$ can be detected by reading out the voltage during the projection or after holding the potential during the light projection by using a sample-hold circuit or the like.

Figure 7:
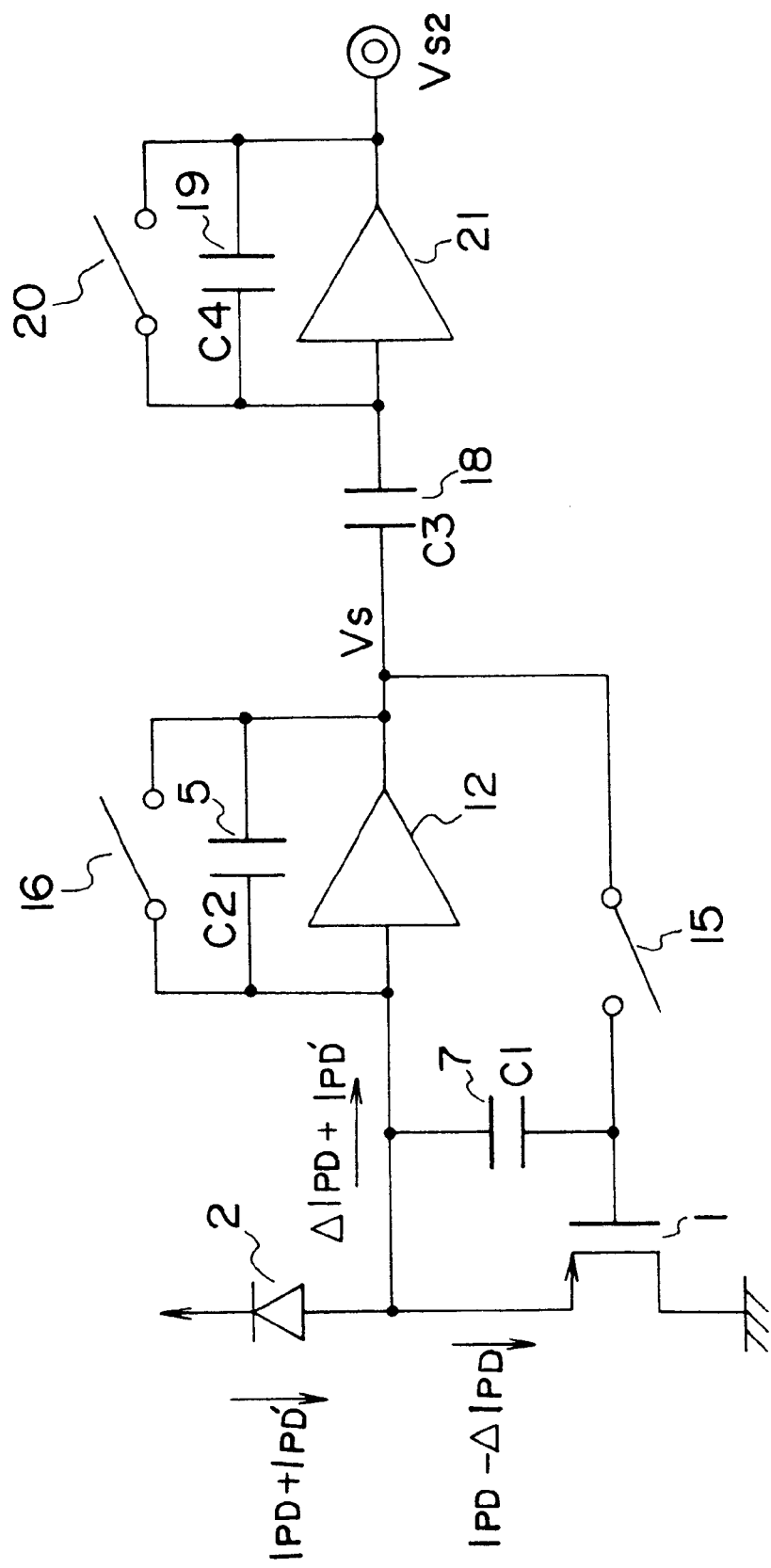
FIG. 7 is a circuit diagram showing the circuit construction of a fourth embodiment of the imager according to the present invention, which further permits error component removal.

FIG. 7 shows a fourth embodiment of the present invention. In this embodiment, an inverting amplifier of capacitance-coupled type is provided after the photo-sensor having the construction as shown in FIG. 3.

Referring to the Figure, a capacitor 18 is connected between the output side of the inverting amplifier 12 and the input of the input side of a next stage inverting amplifier 21, and a capacitor 19 and a reset switch 20 are connected in parallel between the input and output sides of the inverting amplifier 21. The output voltage $V_{s2}$ of the inverting amplifier 21, i.e., the output of the photo-sensor shown in FIG. 7, is obtained as a result of the phase inversion and the amplification with a gain C3/C4 of the output voltage Vs of the inverting amplifier 12. Of the gain C3/C4, C3 is the capacitance of the capacitor 18, and C4 is the capacitance of the capacitor 19.

Figure 8:
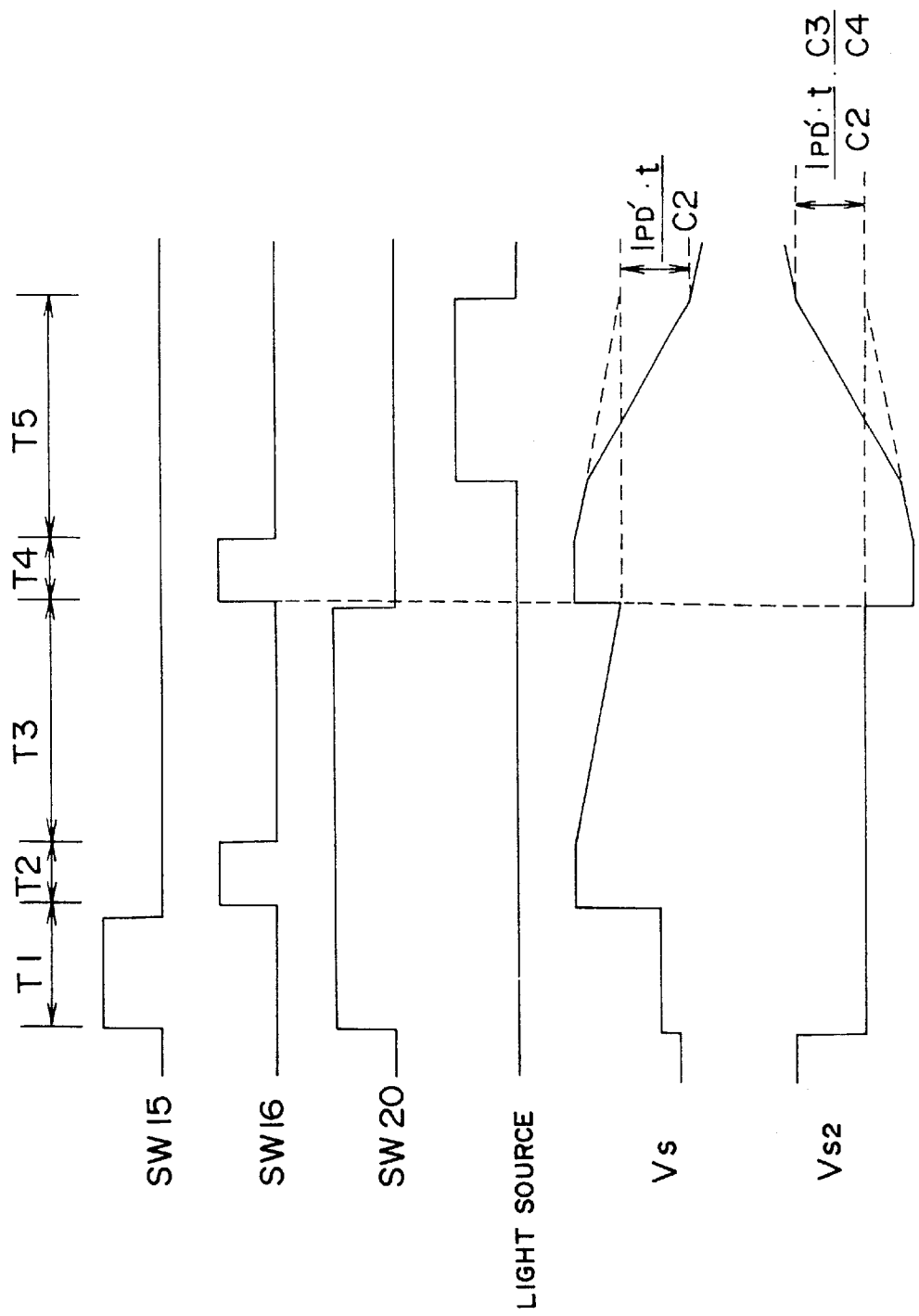
FIG. 8 is a time chart illustrating a background light removal operation and a signal output in the fourth embodiment of the present invention.
Figure 9:
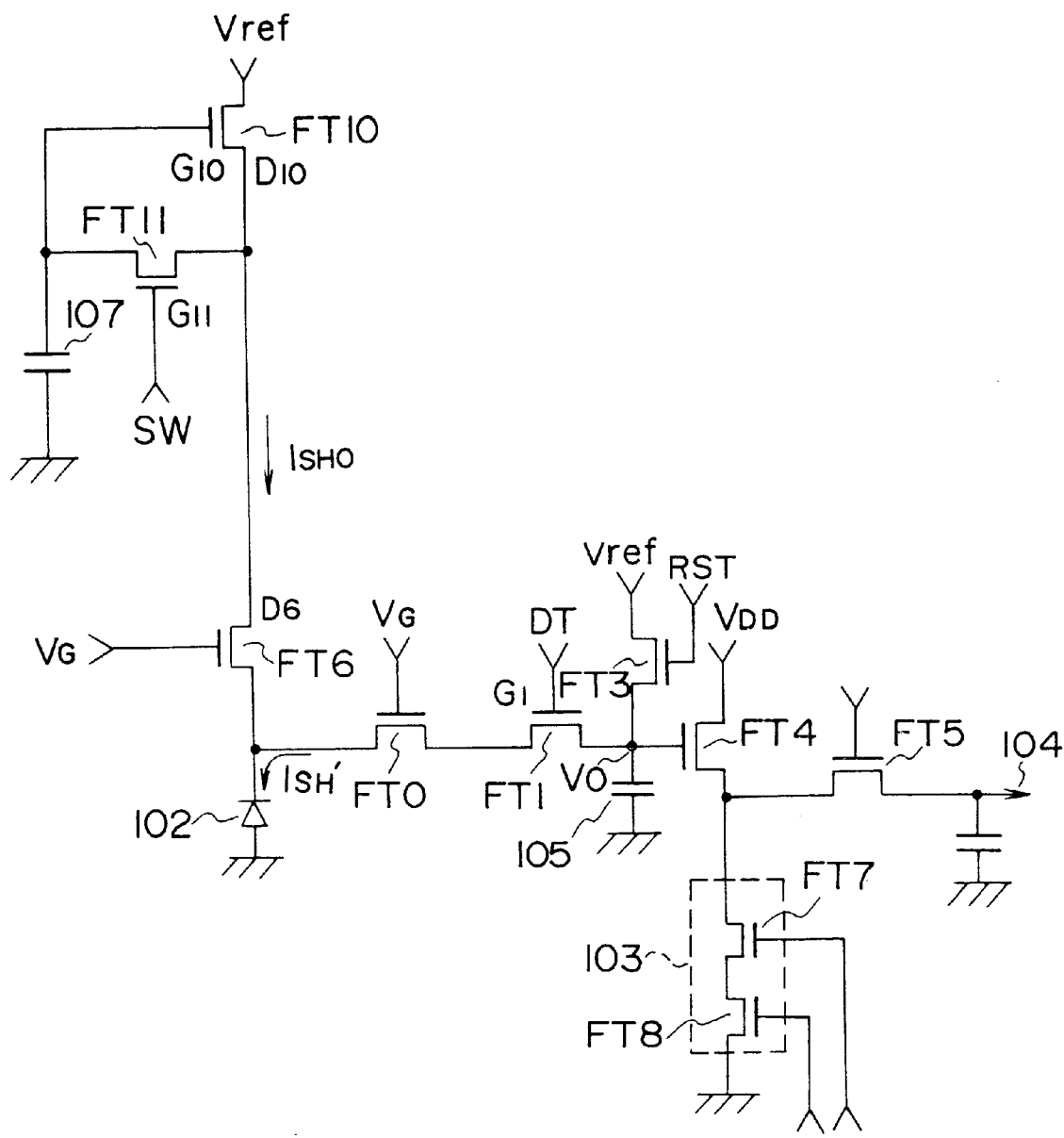
FIG. 9 is a circuit diagram showing a prior art background light removal circuit.

FIG. 8 is a time chart illustrating the operation of the structure shown in FIG. 7. In the Figure, labeled SW15 is the operation of the memory switch 15, SW16 is the output for the reset switch 16, SW20 is the output of the reset switch 20, labeled LIGHT SOURCE is the output of the LED as the light source noted before, $V_s$ is the output voltage of the inverting amplifier 12 (i.e., the output of the photo-sensor shown in FIG. 3), and $V_{s2}$ is the output voltage of the inverting amplifier 21 (i.e., the output of the photo-sensor shown in FIG. 7). In this embodiment, two integrating operations are caused by operating the reset switch 16 for the inverting amplifier 12 for resetting in both the operations with and without the LED light projection, and the difference between the two integrals is detected.

Like the previous embodiment, in the period T1 the background light is stored, and by turning on the memory switch 15 and turning off the reset switch 16 the potential on the background light storage capacitor 7 is held such as to cause discharge of the photo-current IPD due to the background light through the transistor 1.

By turning on the memory switch 15 the charge held in the background light memory capacitor 7 is changed due to the feed-through charge, thus resulting in an error $\Delta I_{PD}$ in the current through the transistor 1. Thus error component $\Delta I_{PD}$ of current flows to the feed-back system of the inverting an amplifier 12. Accordingly, after resetting the projected light detection capacitor 5 by turning on the reset switch 16 in the period T2, the error component is integrated in the subsequent period T3.

In the subsequent period T4, the reset switch 16 is turned on again for resetting the accumulated charge, and then in the period T5 light is projected from the LED for integrating the sum ($\Delta I_{PD}+I_{PD}'$) (of the error current component $\Delta I_{PD}$ and the photo-current $I_{PD}'$ due to the projected light.

The same integration time is set as the periods T3 and T5, and the output corresponding to the photo-current $I_{PD}'$ due to the projected light is detected by taking the difference between the two integrals. As for the difference, the capacitance-coupled inverting amplifier constituted by the components 18 to 21 may be operated as follows.

The reset switch 20 is held "ON" until the end of the integration of the error current component $\Delta I_{PD}$ of current in the period T3, and is turned on right before the reset switch 16 is turned on in the period T4. As a result, as the output voltage $V_{s2}$ of the inverting amplifier 21 subsequent changes in the output voltage $V_s$ of the inverting amplifier 12 appear with reference to the instant of switching of the reset switch 20 from the "ON" to the "OFF" state. Thus, from the output voltage $V_{s2}$ of the inverting amplifier 1 at the instant of end of the integration in the period T5, is removed a voltage corresponding to the error component $\Delta I_{PD}$ of current, i.e., the difference between the output voltage $V_s$ of the inverting amplifier 12 at the instant of end of the first integration in the period T3 and the output voltage $V_{s2}$ of the inverting amplifier 21 at the end of the second integration in the period T5. A voltage corresponding to the projected light photo-current $I_{PD}'$ is thus detected as follow.

$$I_{PD}' \cdot t/C2 \cdot C3/C4$$

where t is the LED light projection time.

As shown, with the construction as shown in FIG. 7, the sole voltage corresponding to the photo-current $I_{PD}'$ due to the projected light can be detected accurately irrespective of whether the current discharged through the transistor 1 contains the error component $\Delta I_{PD}$ of current with respect to the photo-current $I_{PD}'$ due to the background light.

In the above embodiments the signal processing with a single photo-diode has been described. However, the present invention is also applicable to a line sensor having a one-dimensional array of a plurality of photo-diodes for reading out signal with a shift register or the like, and also to a photo-sensor using a PSD (phase sensor element) as the light-receiving element.

As for the line sensor, the present invention is applicable to a passive type line sensor by perfectly holding the transistor 1 to be "OFF".

The embodiments of the present invention described above have the following advantages as claimed in the claims.

In the photo-sensor according to the present invention as in claim 2, switching operations are caused when storing the output signal from the photo-electric converting element in the signal storing circuit and when reading out the output of the inverting amplifier, thus providing a feed-back to the inverting amplifier and permitting accurate signal storing. Beside, it is possible to detect photo-current accurately irrespective of the magnitude thereof. Furthermore, since a single inverting amplifier is used for holding signal and also detecting and amplifying the signal, it is possible to realize the circuit with a reduced number of components.

In the photo-sensor according to the present invention as claimed in claim 3, the signal storing circuit includes the gate capacitance of the transistor, and in the photo-sensor according to the present invention as claimed in claim 4 the signal storing circuit includes the gate capacitance of the transistor that is determined by the size of the gate area of the transistor. Again it is thus possible to realize the photo-sensor with a reduced number of components.

In the photo-sensor according to the present invention as claimed in claim 5, a signal accumulation capacitor and a second switching element for resetting the signal accumulation capacitor are provided between the input and output sides of the inverting amplifier. Thus, the signal accumulation with the inverting amplifier can always be same from a fixed value, thus permitting accurate signal detection.

In the photo-sensor according to the present invention as claimed in claim 6, a resistor and a third switching element in series with the resistor are provided between the input and output sides of the inverting amplifier. It is thus possible to obtain signal detection in the inverting amplifier by using a resistor as well.

In the photo-sensor according to the present invention as claimed in claim 7, the output side of the inverting amplifier is connected to the input side of the next stage inverting amplifier, and a second signal accumulation capacitor and a fourth switching element for resetting the second signal accumulation capacitor are provided between the input and output sides of the next stage inverting amplifier. It is thus possible to remove an error component generated during the detecting operation and obtain further accurate signal detection.

As has been described in the foregoing, the photo-sensor according to the present invention permits accurate storing of a signal corresponding to background light photo-current and obtain signal detection independent of the magnitude of the photo-current and also of the frequency characteristic of photo-sensor circuit.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A photo-sensor comprising a photo-electric converting element, a transistor having the source connected to the photo-electric converting element for passing photo-current generated in the photo-electric converter, an inverting amplifier having the input side connected to the juncture between the photo-electric converting element and the transistor for amplifying the output signal from the photo-electric converting element, a signal storing circuit provided between the source and the gate of the transistor for storing a signal corresponding to the photo-current, and a switching element provided between the output side of the inverting amplifier and the gate of the transistor.

2. The photo-sensor according to claim 1, wherein the switching element executes a switching operation in correspondence to the timing of storing the output signal from the photo-electric converting element in the signal storing circuit.

3. The photo-sensor according to claim 1, wherein the signal storing circuit contains a gate capacitance of the transistor.

4. The photo-sensor according to claim 1, wherein the signal storing circuit contains the gate capacitance of the transistor that is determined by the size of the gate area of the transistor.

5. The photo-sensor according to claim 1, wherein a signal accumulation capacitor and a switching element for resetting the signal accumulation capacitor are provided between the input and output sides of the inverting amplifier.

6. The photo-sensor according to claim 1, wherein a resistor and a switching element in series with the resistor are provided between the input and output sides of the inverting amplifier.

7. The photo-sensor according to claim 5, wherein the output side of the inverting amplifier is connected to the output side of a second stage inverting amplifier, and a signal accumulation capacitor and a switching element for resetting the signal accumulation capacitor are provided between the input and output sides of the second stage inverting amplifier.

* * * * *